United States Patent [19]

Bryant

[11] 4,061,909

[45] Dec. 6, 1977

[54] VARIABLE WAVEFORM SYNTHESIZER USING DIGITAL CIRCUITRY

[76] Inventor: A. William Bryant, 3457 Eye St., Eureka, Calif. 95501

[21] Appl. No.: 598,500

[22] Filed: July 23, 1975

[51] Int. Cl.[2] ............................................ H03K 13/00

[52] U.S. Cl. ...................................... 364/851; 328/14; 340/347 DA

[58] Field of Search ................... 340/347 DA, 167 A; 235/197, 150.53; 328/14, 27, 185, 58; 321/9 A, DIG. 1; 318/599

[56] References Cited

U.S. PATENT DOCUMENTS

| | | | |
|---|---|---|---|
| 2,977,518 | 3/1961 | Kafka et al. | 321/9 A |
| 3,215,860 | 11/1965 | Neumann | 328/27 X |
| 3,334,292 | 8/1967 | King et al. | 321/9 A |
| 3,586,985 | 6/1971 | Schoendorff | 328/58 X |
| 3,605,002 | 9/1971 | Smyth | 340/210 |
| 3,656,151 | 4/1972 | Richeson | 340/347 DA |
| 3,657,657 | 4/1972 | Jefferson | 328/14 |
| 3,752,973 | 8/1973 | Thorn et al. | 235/197 |
| 3,778,814 | 12/1973 | Dildy | 340/347 DA |
| 3,838,414 | 9/1974 | Wiles | 340/347 DA |

OTHER PUBLICATIONS

Landee et al., Electronic Designers' Handbook, 1957, McGraw-Hill Book Co., pp. 22-4, 22-14 to 22-17.

*Primary Examiner*—Thomas J. Sloyan
*Attorney, Agent, or Firm*—Townsend and Townsend

[57] ABSTRACT

A variable waveform synthesizer capable of converting a digital pulse train to a variety of analog waveforms. A binary counter responsive to the digital pulse train supplies sequential binary counting outputs to a decoding network. The decoding network decodes the counter states and provides a plurality of individual pulse outputs, each output active in response to only one state of the binary counter. A gate pulse generator is also provided to vary the width of the digital pulse train. Each decoder output, after combination with the gate pulse, is applied to a synthesizing network that varies the amplitude of the pulses received and constructs from these varied amplitude pulses an approximate analog waveform. Current sources are used to construct from the sequential pulses received, pulses of varying amplitude. An output circuit accepts and combines these pulses to synthesize an approximate symmetrical analog waveform.

7 Claims, 4 Drawing Figures

VARIABLE WAVEFORM SYNTHESIZER USING DIGITAL CIRCUITRY

BACKGROUND OF THE INVENTION

1. Field of the Invention

This invention relates generally to the generation of symmetrical analog waveforms and specifically to the generation of symmetrical analog waveforms by digital circuitry to which has been applied a digital pulse train.

2. Description of the Prior Art

It has been found that in some instances data transmission by and/or between digital computers or digital signal generating equipment can be better effected when the information is encoded for transmission in analog (multi-valued) form. Further, analog waveform generating circuits can provide a computer with the possibility of generating speech or music.

While conventional analog circuitry, utilizing inductive and capacitive elements, can be activated by digital computers to produce practically any type of analog waveforms desired, such methods are not without problems. For example, the equipment may be required to operate over a relatively wide temperature range. In order to operate satisfactorily over wide temperature ranges, the inductive and capacitive elements must have a low temperature sensitivity. Fabrication of such low temperature sensitivity elements can give rise to higher manufacturing costs. Another drawback lies in the bulky size of the inductors and capacitors required when low frequencies are desired.

Digital circuits, for the most part, do not require elements having strict electrical values or low temperature sensitivities, can usually operate on low power requirements, and are capable of miniaturization.

BRIEF SUMMARY OF THE INVENTION

The present invention provides a waveform synthesizer that accepts a digital pulse train and, through the use of digital circuitry, produces a sequence of varied and variable amplitude, variable width, pulses which are combined to construct an analog waveform. A digital pulse train, generated internally or accepted from an external source, is applied to a binary counter which sequentially assumes a predetermined number of binary states. The counter output is decoded by a decoding network which provides a number of output lines each of which is responsive to one and only one state of the binary counter. As each binary state is assumed by the counter, the corresponding decoder output line becomes active during the time the counter remains in that state. The output of the decoding network, then, is a plurality of pulses sequentially appearing on the individual output lines thereof. A gate pulse generator is provided to also receive the pulse train and generate therefrom a variable width gate pulse which is combined with each decoder output. This gate pulse-decoder combination results in a series of variable width pulses sequentially appearing on a predetermined number of output lines. Each gate pulse-decoder combination is received by a synthesizing network and used to sequentially activate a number of current sources, there being one current source for each gate pulse-decoder combination. The current sources all commonly feed a resistor across which appears a sequence of pulses of different amplitudes in response to the sequential activation of the current sources by the gate pulse-decoder output combinations. An integrating network accepts this sequential pulse sequence to construct therefrom the desired analog waveform. Therefore, an object of this invention is to provide a waveform synthesizer capable of generating analor waveforms in response to a digital pulse train.

A further object of this invention is to provide an analog waveform synthesizer, utilizing digital circuitry, with the capability of allowing selection between a variety of possible outputs.

It is an associated object to provide a waveform generator capable of interfacing with other digital systems that can produce or synthesize analog waveforms in response to commands from the digital systems interfaced therewith.

Other objects and advantages of the invention will become apparent upon reading the following detailed description and upon reference to the drawings.

DETAILED DESCRIPTION OF THE INVENTION

Figures 1, 2:
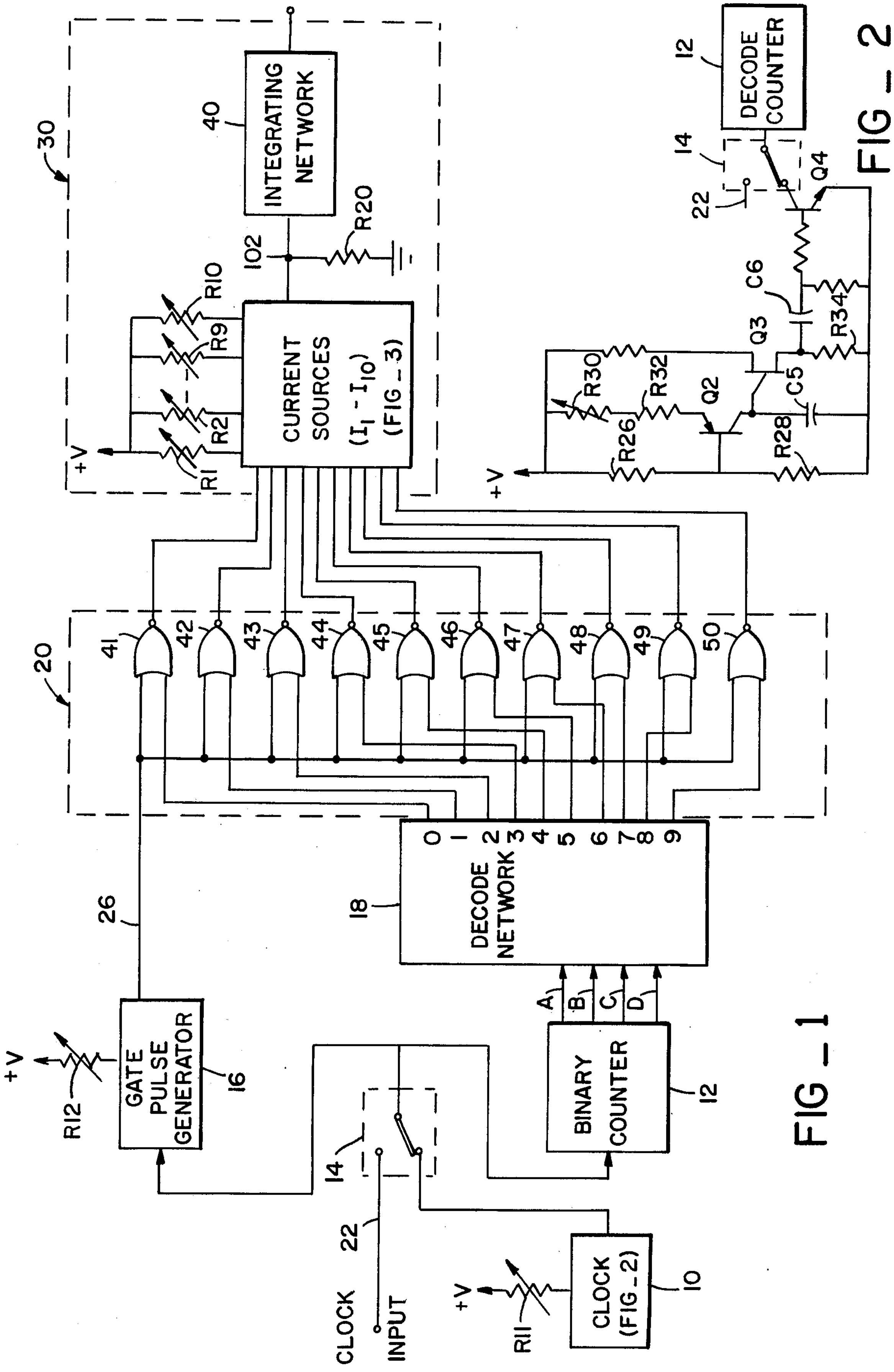
FIG. 1 is a functional block diagram representation of a variable waveform synthesizer according to the present invention.
FIG. 2 is a schematic representation of a clock to produce a digital pulse train for use with the synthesizer of FIG. 1.

Referring to FIG. 1, the preferred embodiment of this invention is shown to contain clock 10, which generates a digital pulse train 70 (FIG. 4) that is applied, via selector switch 14, to binary counter 12 and gate pulse generator 16. Alternatively, selector switch 14 can be used to select input line 22 to allow an externally generated digital pulse train to be applied to binary counter 12 and gate pulse generator 16. Binary counter 12 is a decode counter capable of sequentially assuming ten separate binary states repeatedly. Outputs A–D of counter 12 are applied to decode network 18 which decodes each digital state assumed by binary counter 12. Decode network 18 provides an output line for each digital state the counter 12 assumes, each output being activated when the particular state associated therewith is decoded. The gate pulse generator 16, in response to the digital pulse train also applied thereto, generates a pulse which is combined with the individual output lines of the decoder 18 by combining network 20. Combining network 20 outputs are individually applied to the output network 30 current sources I1–I10. Each current source will generate a pulse of predetermined amplitude when activated in response to a pulse from combining network 20. The output from current sources I1–I10 is received and summed by resistor R20 and then applied to integrating network 40 which develops the synthesized multi-valued waveform by averaging the variable amplitude pulses applied thereto.

At this point, with reference to FIG. 2, a suitable circuit for generating a digital pulse train will be described. Clock 10 is shown as a free running unijunction transistor oscillator. Transistor Q2 acts as a current source to linearly charge capacitor C5. The bias of transistor Q2 is set by resistors R26 and R28. The rate at which capacitor C5 charges is determined by the current level provided by transistor Q2 and is, therefore, a function of resistors R30, a variable resistor, and R32. When capacitor C5 charges to the trip voltage of unijunction transistor Q3, Q3 conducts thereby causing a pulse to appear across resistor R34. This pulse is coupled through capacitor C6 to transistor Q4 for driving binary counter 12 when selector switch 14 is in the internal position.

As can be seen in FIG. 2, varying resistor R30 will vary the charging rate of capacitor C5. This, in turn, will vary the number of times Q3 conducts to generate a pulse in any given time period. Clock 10 is thereby capable of providing a digital pulse train whose repetition rate is variable.

Figure 4:
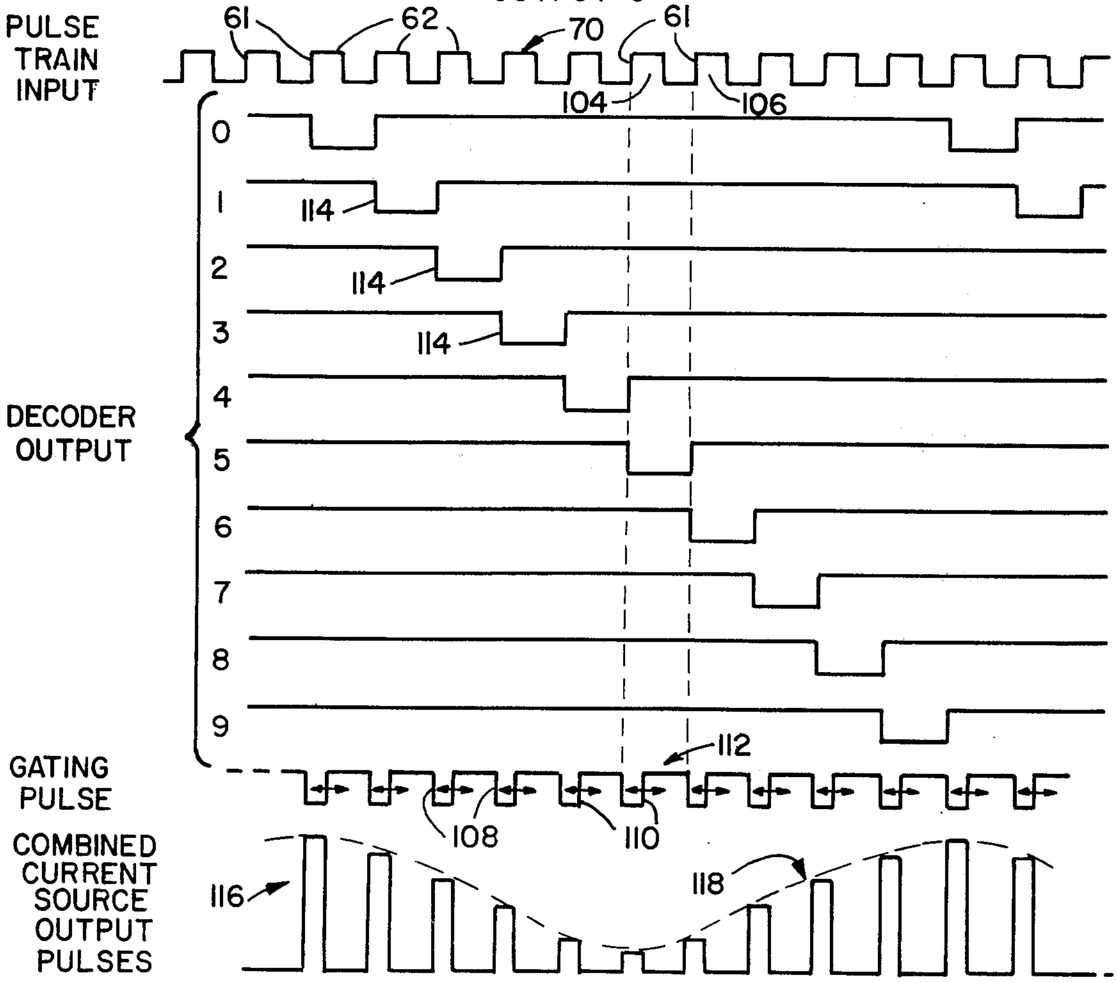
FIG. 4 is a waveform representation of the internal as well as output waveforms generated by the synthesizer of FIG. 1.

Referring now to FIGS. 1 and 4, operation of the binary counter 12, decode network 18, and gate pulse generator 16 as well as their respective outputs will now be described. The digital pulse train 70, depicted in FIG. 4, selected by the selector switch 14, is applied to the binary counter 12. Binary counter 12 is a decade counter which has the capability of assuming ten separate states in sequential order and repeating those states so long as digital pulses are applied thereto. Such a decade counter, the SN 7490, is commercially manufactured by Texas Instruments Company, Inc. The output of counter 12, a four-bit binary coded decimal (BCD), is applied to the decode network 18. A BCD to decimal converter, decode network 18 has ten output lines, one for each of the states the decade counter 12 is capable of assuming.

The output lines of the decode network 18 are typically at an upper voltage level representative of a binary one. When an output line of decode network 18 is activated, by the binary counter assuming the binary state associated with that particular line, the line assumes a lower voltage representative of a binary zero. For example, if counter 12 outputs a BCD count of zero (0000) to decode network 18, output 0 of decode network 18 will become a binary zero while the remaining nine outputs 1–9 of decode network 18 remain at a binary one. The next pulse of the digital pulse train received by counter 12 will cause the counter to assume the next sequential state representing a BCD one (0001). When counter 12 outputs are now applied to the decode network 18, output 0 of the decode network 18 will become a binary one and output 1 will become a binary zero. This procedure repeatedly continues through all ten states achievable by the counter 12, causing each of the decoder 18 output lines to sequentially become active with what are essentially negative-going pulses.

Such negative-going pulses appearing on the decode circuit 18 outputs 0–9 are illustrated in FIG. 4. The pulse width of the negative-going pulses outputted by decode network 18 is determined by amount of time the binary counter 18 remains in any one state. Moreover, the negative-going pulses on decode network 18 outputs 0–9 are in sequential order and are in one-to-one correspondence to the 10 digital states sequentially assumed by the binary counter 12.

Selector switch 14 also applies the digital pulse train to gate pulse generator 16 which is a one shot multivibrator. Typically, a multivibrator such as the Ser. No. 74121 commercially available from Texas Instruments Company, Inc. may be used. Preferably, such a multivibrator will have the capability of producing a pulse the width of which may be varied by varying a resistor connected thereto, as does the Ser. No. 74121. Thus, resistor R12 is provided for varying the pulse width of the pulse generated by gate generator 16.

The output of gate pulse generator 16 is, like the individual decode network 18 outputs, a negative-going pulse of variable width as indicated in FIG. 4.

The output of the gate pulse generator 16, via line 26, is combined with outputs 0–9 of decode network 18 by combining network 20 consisting of NOR gates 41–50. NOR gates 41–50 are of the type that output a binary one whenever the two inputs are simultaneously a binary zero. Alternatively, a binary zero will be output from any of NOR gates 41–50 if any of the inputs thereto are a binary one. The output of any one of the NOR gates 41–50 will be a positive pulse whenever the negative-going gate pulse on line 26 and a negative-going pulse from one of the decode network outputs 0–9 coincide in time at the inputs of one of the NOR gates.

At this point it is of benefit to consider in greater detail, with reference to FIG. 4, the time relationships between the various pulses discussed thus far. When each pulse 62 of the digital pulse train 70 is received by counter 12, a change from one binary state to the next sequential binary state will occur. This change of state will occur, when the Texas Instrument Ser. No. 7490 decade counter is used, essentially upon the rising edge 61 of the pulses 62 of the digital pulse train 70. As counter 12 experiences a sequential change from one state to another, a negative pulse will be propagated from one output of decode network 18 to another output. For example, assume binary counter 12 to be in the binary state associated with output 4 of decode network 18. As FIG. 4 indicates, output 4 will be a binary zero. When the rising edge 61 of pulse 104 is received by counter 12, output 4 will become a binary one while output 5 becomes a binary zero. The negative pulse is again propagated from output 5 to output 6 of decode network 18 when rising edge 61 of pulse 106 is received by counter 12. It should be evident, to those skilled in the art, that the rising edges 61 of pulse train 70 and falling edges 114 of the negative pulses propagating through decoder outputs 0–9 are essentially occurring at the same time if conventional transistor-transistor-logic is used in decode network 18.

Similarly, when pulse train 70 is applied to gate pulse generator 16 the gate pulses 112 are generated with falling edges 108 essentially occurring upon receipt of the rising edges 61 of pulse train 70. Thus, the falling edges 114 of the negative pulses appearing on the decoder outputs 0–9 are essentially coincidental with falling edges 108 of gate pulses 112.

Varying resistor R12 (FIG. 1) will vary the width of gate pulses 112 by moving rising edges 110 of gate pulses 112 towards or away from falling edges 108. Combining gate pulses 112 with decoder outputs 0–9, as is done by combining network 20, results in the generation of 10 sequential positive-going pulses (not shown) the widths of which are variable.

Figure 3:
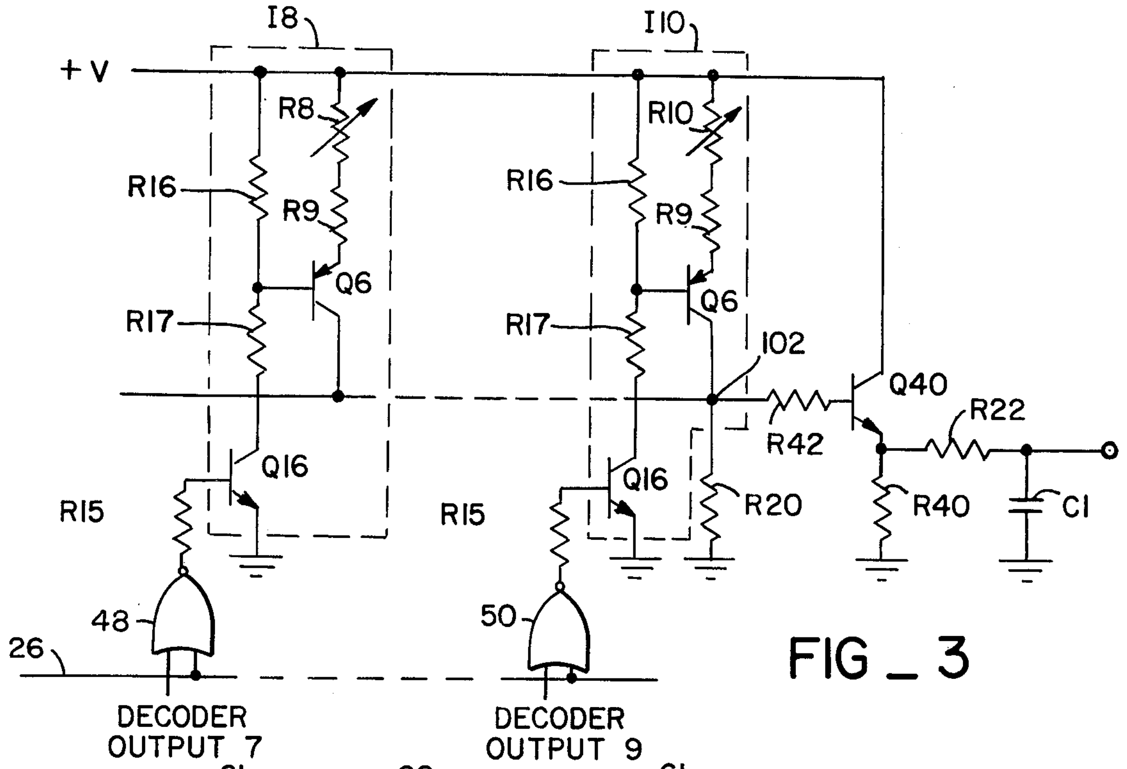
FIG. 3 is a schematic representation of two of the current sources used in the synthesizer of FIG. 1 to produce pulses of varied amplitudes.

Each output of NOR gates 41–50 is attached to one of the current sources I1 through I10. Referring now to FIG. 3, which schematically illustrates two of the 10 current sources, their operation may now be understood. All current sources are identical and, therefore, a discussion of the circuitry comprising current source I8 will apply to the remaining nine current sources.

As shown in FIG. 3, the output of NOR gate 48 is connected through base current limiting resistor R15 to the transistor switch Q16 of current source I8. A binary zero on the output of NOR gate 48 will place transistor Q16 in an off or non-conducting condition causing the base of transistor Q6 to assume a +V voltage. Transistor Q6, which is the current source transistor, is then in a non-conducting condition.

Coincidence between the negative pulses of output 7 of decoder 18 and gate pulse line 26 at the inputs of NOR gate 48 will cause current source I8 to conduct as follows. The output of gate 48, when such coincidence occurs, will be a binary one placing the base of transistor Q16 at a voltage level more than sufficient to cause it to conduct. This, in turn, allows the base of Q6 to assume a lower voltage level, determined by resistors R16 and R17, sufficient to place Q6 in a conducting state. When either input to NOR gate 48 becomes a binary one, the output of NOR gate 48 becomes a binary zero causing Q16 to cease conducting. Since a current is no longer flowing through resistors R16, R17, the base of Q6 will assume the voltage level of the supply voltage and cease conducting.

The amount of current provided by Q6, when in a conducting state, is determined by variable resistor R8. Thus, the current produced by current source I8 may be predetermined by the resistive value resistor R8 is set to. This, in turn, provides adjustment of the amplitude of the voltage pulse seen across R20 produced by the current source I8.

As indicated in FIG. 3, the collectors of the current sources I1 through I10 are jointly connected and share resistor R20. During operation, therefore, a series of positive pulses will be developed across R20 and appear at current source output 102. These pulses will have amplitudes that are directly related to the predetermined resistance settings of the variable resistors R1–R10. Such a train of variable amplitude pulses 116 is illustrated in FIG. 4.

The variable amplitude pulses 116 created by current sources I1 through I10, appearing at current source output 102, are then applied to an integrating network, comprising R22 and Cl, to develop an output which is a synthesized average level signal 118 of the pulses so applied. A buffer amplifier, comprising resistors R42, R40 and transistor Q40, may be used to transfer the pulses from the current source output 102 to compensate for integrator losses.

It will be appreciated that the synthesized waveform developed by the integrating network may be varied in a number of ways. For example, the frequency of the signal may easily be modified by adjusting the rate of the digital pulse train generated by the internal clock 10. The shape and amplitude of the output waveform can be modified by changes to the pulse widths or pulse amplitudes of the pulses received by the integrating network. As explained above, the pulse width is varied by varying the gate pulse produced by the gate pulse generator; variable resistor R12 is provided for this purpose. The pulse amplitudes are modified by varying the resistance settings of resistors R1–R10.

Thus, it is apparent that there has been disclosed in accordance with this invention, a variable waveform synthesizer that converts a digital pulse train to an analog waveform fully satisfying the objects set forth. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A variable waveform synthesizer for accepting a digital pulse train of a predetermined period and constructing therefrom a variety of multi-valued waveform approximations comprising:

counting means for receiving the digital pulse train and sequentially assuming in response thereto N separate and distinct digital states;

pulse generating means responsive to the digital pulse train for generating a digital pulse stream of pulses each of the pulses of the digital pulse stream being less than the predetermined period of the digital pulse train, the pulse generating means including means for varying the width of the pulses;

decoding means responsive to the counting means for decoding at most N digital states and including at most N individual outputs, each decoder output activated in a predetermined order in response to the digital states assumed by the counting means;

combining means responsive to the pulse generating means and the decoding means outputs and having a number of combining means outputs in one-to-one relation with each of the decoder means outputs so that the width of the pulses output from the combining means will be determined by the coincidence between the pulse generator output and the decoder outputs; and synthesizing means for accepting the outputs of the combining means and generating therefrom a pulse of a predetermined amplitude for each activated decoder output and including output means responsive to said pulses for constructing therefrom a multi-valued waveform approximation.

2. The waveform synthesizer of claim 1, wherein the synthesizing means comprises:

means responsive to at least one of each of the decoder outputs for generating a predetermined amount of current such that as each said decoder output becomes activated in response to its respective binary state sequentially assumed by the binary counting means a corresponding and predetermined amount of current is generated; and means connecting the current generating means and the output means for receiving the currents generated to create pulses therefrom.

3. The variable waveform synthesizer of claim 1, wherein:

the number of digital states sequentially attained by the binary counter is ten; and the number of outputs from the decoding means is 10.

4. The variable waveform synthesizer of claim 1, wherein the output means comprises:

integrating means responsive to said pulses for constructing therefrom the multi-valued waveform approximation.

5. A variable waveform synthesizer for generating a variety of analog waveform approximations comprising:

first pulse generating means for generating a digital pulse train of a predetermined period, T, the first generating means including means for varying the repetition rate of said pulse train;

second pulse generating means responsive to said first pulse generating means for generating a pulse having a pulse width less than T for each pulse contained in the digital pulse train, the second pulse generating means including means for varying the pulse width of the pulses generated thereby;

binary counter means responsive to the first pulse generating means and capable of sequentially attaining N separate and distinct digital states;

decoding means responsive to said binary counter for decoding each of the digital states attained by the binary counter, said decoding means having at most N individual outputs each of which activated in response to one and only one of the N states attained by the binary counter means;

combining means responsive to the decoding means outputs and the second pulse generating means and having at most N combining means outputs activated by coincidence between the decoding means outputs and the second pulse generating means;

a plurality of constant current sources responsive to the combining means outputs such that when a combining means output is activated the current source coupled thereto is placed in a conducting state causing a current to flow therefrom, each of the current sources including means for varying the current provided thereby; and output means for receiving and combining the current produced by the current sources and synthesizing therefrom the analog waveform approximation, the output means including integrating means for shaping the analog waveform approximation.

6. The variable waveform synthesizer of claim 5, wherein N equals 10.

7. The variable waveform synthesizer of claim 1, wherein the synthesizing means includes a plurality of current sources responsive to activation of each combining means output to place the current source coupled thereto in a current conducting state.

* * * * *